US009699848B2

(12) United States Patent
Herfurth et al.

(10) Patent No.: US 9,699,848 B2
(45) Date of Patent: Jul. 4, 2017

(54) SYSTEM AND METHOD FOR A SWITCHED-MODE POWER SUPPLY

(71) Applicant: Infineon Technologies Austria AG, Villach (AT)

(72) Inventors: Michael Herfurth, Gilching (DE); Gong Xiaowu, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/573,582

(22) Filed: Dec. 17, 2014

(65) Prior Publication Data

US 2016/0181918 A1    Jun. 23, 2016

(51) Int. Cl.
| | |
|---|---|
| H02M 3/158 | (2006.01) |
| H05B 33/08 | (2006.01) |
| H02M 1/08 | (2006.01) |
| H02M 3/156 | (2006.01) |
| H03K 17/041 | (2006.01) |
| H02M 1/00 | (2006.01) |

(52) U.S. Cl.
CPC .......... *H05B 33/0845* (2013.01); *H02M 1/08* (2013.01); *H02M 3/156* (2013.01); *H03K 17/04106* (2013.01); *H05B 33/0815* (2013.01); *H05B 33/0818* (2013.01); *H02M 2001/0058* (2013.01); *Y02B 70/1491* (2013.01)

(58) Field of Classification Search
None
See application file for complete search history.

(56) References Cited

U.S. PATENT DOCUMENTS

| | | | | |
|---|---|---|---|---|
| 7,218,164 | B2* | 5/2007 | Vitale | H03K 17/14 327/376 |
| 2009/0295228 | A1* | 12/2009 | Ochi | H02M 3/156 307/66 |
| 2010/0156314 | A1* | 6/2010 | Wang | H05B 33/0815 315/294 |
| 2011/0148368 | A1* | 6/2011 | Burns | H03K 17/102 323/225 |
| 2012/0039096 | A1* | 2/2012 | Dunipace | H02M 1/36 363/21.12 |
| 2013/0127353 | A1* | 5/2013 | Athalye | H05B 33/0815 315/193 |

(Continued)

OTHER PUBLICATIONS

"Design Note—DN06047/D; High Voltage HB-LED Driver," ON Semiconductor, www.onsemi.com, Rev. 0, Oct. 2008, pp. 1-10.

(Continued)

*Primary Examiner* — Crystal L Hammond
(74) *Attorney, Agent, or Firm* — Slater Matsil, LLP

(57) ABSTRACT

In accordance with an embodiment, a method of operating a switched-mode power supply includes controlling a first switch coupled between an inductor and a reference node. Controlling includes modulating a first switching signal to control a first current through the first switch to a first predetermined current, and attenuating a current supplied by the first switch to the inductor in accordance with an attenuation factor to form an attenuated current. Attenuating includes providing a pulse modulated signal to a second switch coupled between the first switch and the inductor, where the attenuation factor is related to a pulse density of the pulse modulated signal.

27 Claims, 7 Drawing Sheets

(56) References Cited

U.S. PATENT DOCUMENTS

| | | | | |
|---|---|---|---|---|
| 2013/0234621 A1* | 9/2013 | Athalye | ............... | H02M 3/158 |
| | | | | 315/307 |
| 2014/0070728 A1* | 3/2014 | Pflaum | ............... | H05B 33/0815 |
| | | | | 315/307 |
| 2014/0327372 A1* | 11/2014 | Zhang | ............... | H05B 33/0815 |
| | | | | 315/224 |
| 2015/0334800 A1* | 11/2015 | Fawaz | ............... | H05B 33/0812 |
| | | | | 315/294 |

OTHER PUBLICATIONS

"SSL2109; Greenchip controller for LED lighting," NXP Semiconductor, Preliminary data sheet, Rev. 1.1, Apr. 10, 2012, pp. 1-19.
Hsiao, A. et al., "TPS92210 Single Stage PFC Flyback Design for 10W PA R30/38 LED lamp," Texas Instruments, Application Report, http://www.ti.com/lit/an/slva459/slva459.pdf, 2011, pp. 1-24.
"Universal and Dimmable LED Driver," Grenergy GR8210, Version 1.01, www.grenergy-ic.com, Apr. 2010, pp. 1-14.

* cited by examiner

SYSTEM AND METHOD FOR A SWITCHED-MODE POWER SUPPLY

TECHNICAL FIELD

The present disclosure relates generally to an electronic device, and more particularly to a system and method for a switched mode power supply.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer and reduces energy lost due to power dissipation across resistive voltage drops.

A SMPS usually includes at least one switch and an inductor or transformer. Some specific topologies include buck converters, boost converters, and flyback converters, among others. A control circuit is commonly used to open and close the switch to charge and discharge the inductor. In some applications, the current supplied to the load and/or the voltage supplied to the load is controlled via a feedback loop.

One application of an SMPS is as a power supply for a light emitting diode (LED), such as those used in residential and commercial lighting applications to replace incandescent light bulbs and compact florescent lamps (CFL). In some applications, a SMPS is used to convert an AC line voltage to a DC current in order to power the LED.

SUMMARY OF THE INVENTION

In accordance with an embodiment, a method of operating a switched-mode power supply includes controlling a first switch coupled between an inductor and a reference node. Controlling includes modulating a first switching signal to control a first current through the first switch to a first predetermined current, and attenuating a current supplied by the first switch to the inductor in accordance with an attenuation factor to form an attenuated current. Attenuating includes providing a pulse modulated signal to a second switch coupled between the first switch and the inductor, where the attenuation factor is related to a pulse density of the pulse modulated signal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for switched mode buck converter for light emitting diodes (LEDs). Embodiments of the present invention may also be applied to other switched-mode power supply configurations and other systems and applications including other circuits that switch including, but not limited to, power systems and motor control systems.

In an embodiment of the present invention, a buck converter for powering a light emitting diode includes a buck converter circuit having a switch coupled in series with a cascode transistor. An inductor and a freewheeling diode are coupled to the drain of the cascode transistor, and a load, such as an LED is coupled to the inductor. During operation, a pulse width modulated signal, for example, of about 50 kHz is provided to the switch in order to control the current through the switch to a first predetermined current. A pulse modulated signal, for example, of about 1 kHz having a pulse density proportional to a desired brightness level of the LED is provided to the gate of the cascode transistor. It should be understood that other frequencies may be used in other embodiments.

During operation, the brightness of the LED may be controlled using the pulse modulated signal. For example, when the pulse modulated signal has a high pulse density, more current flows through the LED for a high light intensity. On the other hand, when the pulse modulated signal has a low pulse density, less current flow through the LED for a lower light intensity.

In some embodiments, the cascode transistor, as well as the circuitry that controls the state of the cascode transistor may be separate from an integrated circuit on which the switch and its control circuitry are disposed. Consequently, efficient dimming of an LED or other circuits may be inexpensively accomplished using standard off the shelf switched-mode power supply controller ICs along with external circuitry.

Figure 1:
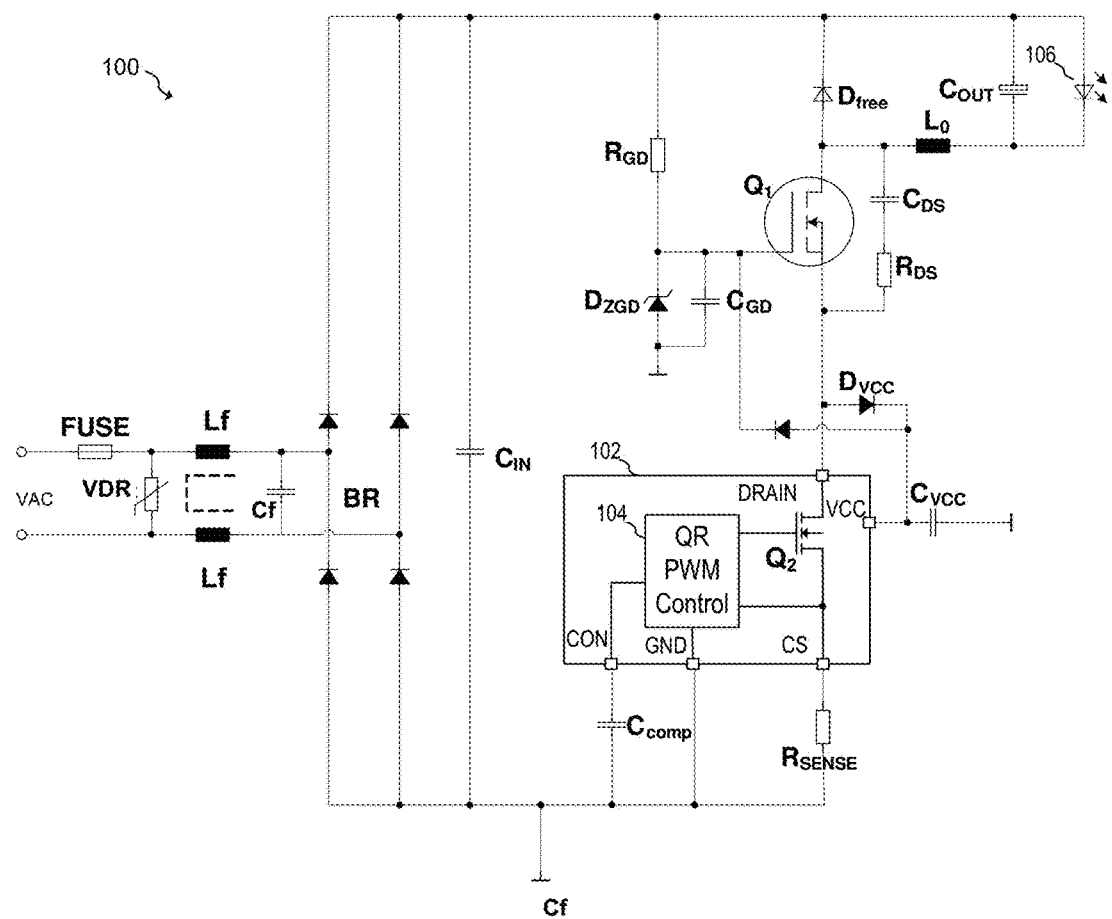
FIG. 1 illustrates an exemplary power supply system.

FIG. 1 illustrates an exemplary buck converter power supply system 100 that includes a buck converter IC 102 coupled to load circuit 106 represented as an LED via cascode transistor $Q_1$ and inductor $L_0$. IC 102, which may be implemented using an INFINEON ICL8201 buck converter IC, includes a control circuit 104 coupled to switching transistor $Q_2$. During operation, control circuit 104 provides a pulse width modulated (PWM) signal to the gate of switching transistor Q2 using, for example a quasi-resonant mode of operation. Control circuit 104 determines a current flowing through switching transistor $Q_2$ by measuring a voltage across resistor $R_{SENSE}$, and adjusts the pulse width of the (PWM) in order to produce a fixed average current through switching transistor $Q_2$. The measured voltage across resistor $R_{SENSE}$ may be further processed by performing a peak detection of the voltage, determining an average voltage, or other type of calculation. When switching transistor $Q_2$ is activated, current flows through switching transistor $Q_2$, cascode transistor $Q_1$, inductor $L_0$ and load circuit 106. When switching transistor $Q_2$ is deactivated, current flows through load circuit 106, inductor $L_0$, and freewheeling diode $D_{free}$.

Diode bridge BR rectifies input voltage VAC, which may be an AC input line voltage to provide a DC input voltage to buck converter power supply system 100. The gate of cascode transistor $Q_1$ is biased via resistor $R_{GD}$ and zener diode $D_{ZGD}$. Capacitor $G_{GD}$ is coupled in parallel to zener diode $D_{ZGD}$ and is used to filter voltage ripple at the output of diode bridge BR from appearing at the gate of cascode transistor $Q_1$. Supply voltage VCC is produced for IC 102 via diode $D_{VCC}$. The voltage of VCC is about $V_{DZ}$–Vth1– $V_{DVCC}$, where $V_{DZ}$ is the zener voltage of $V_{ZGD}$, Vth1 is the threshold voltage of cascode transistor $Q_1$ and $V_{DVCC}$ is the forward voltage of diode $D_{VCC}$. For example, if the zener voltage of diode $D_{ZGD}$ is about 12 V, the threshold of cascode transistor $Q_1$ is about 3V, and the forward voltage of diode $D_{VCC}$ is 0.7 V, the resulting voltage at the VCC pin of IC 102 is about 8.3 V.

As is further shown in FIG. 1, a fuse, a varistor VDR for limiting transient input voltages and a filter including inductors Lf and capacitor Cf that is used for EMI suppression during switched mode operation. The series combination of capacitor $C_{DS}$ and resistor $R_{DS}$ provide a feed forward path from inductor $L_0$ to IC 102 for the use of zero voltage or valley detection for the quasi-resonant mode of operation. For example, after switching transistor $Q_2$ is turned off and inductor $L_0$ has been demagnetized, freewheeling diode $D_{free}$ becomes reversed bias and the drain node of cascode transistor $Q_1$ begins to ring or oscillate at a frequency determined by the value of inductor $L_0$ and the value of capacitance coupled to the drain of cascode transistor $Q_1$. By detecting minimum voltage at the drain of cascode transistor Q1 during this period of ringing and turning on switching transistor $Q_2$ at when the voltage at the drain of cascode transistor $Q_1$ is at a minimum, switching losses may be reduced. Various valley switching and quasi-resonant circuits and systems known in the art may be used to implement valley switching and the quasi-resonant mode of operation in the various embodiments of the present invention.

Integrated circuit 102 includes five pins: DRAIN, CS, VCC, GND, and CON. The DRAIN pin and the CS pins are coupled to the drain and source terminals of switching transistor Q2, respectively. The VCC pin and the GND pin are coupled to the power supply for the internal circuitry of integrated circuit 102, and the CON pin interfaces with external capacitor $C_{COMP}$ that is used to establish timing of the pulse width modulated signals provided by control circuit 104.

Figure 2:
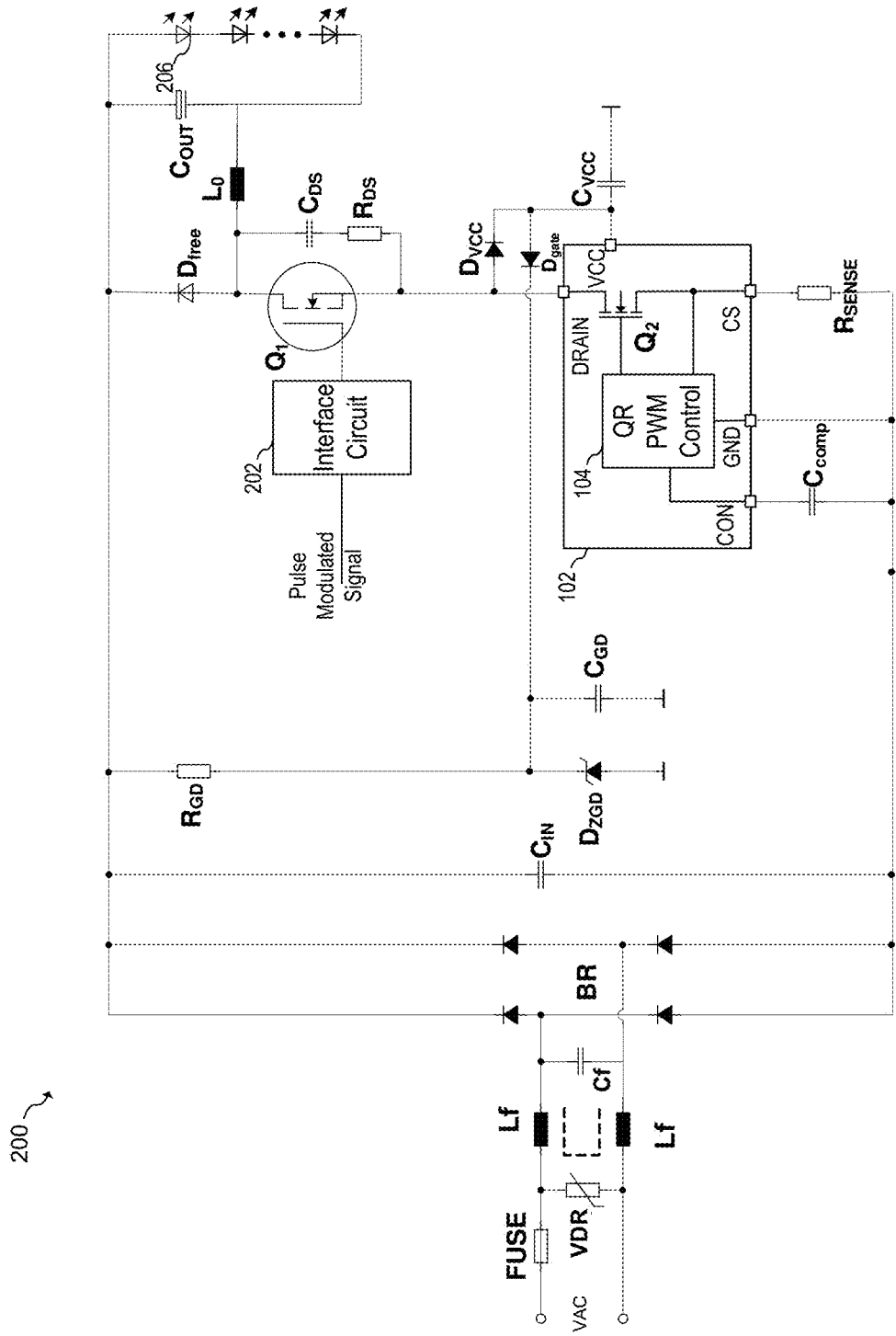
FIG. 2 illustrates an embodiment power supply system.

FIG. 2 illustrates power supply system 200 according to an embodiment of the present invention. As shown, the gate of cascode transistor $Q_1$ is coupled to interface circuit 202 that applies a pulse modulated signal to the gate, such that cascode transistor is turned on and off in accordance with the pulse modulated signal, thereby attenuating the current to load 206 that may include any number of series connected LEDs. Alternatively, a single LED or other type of load may be used in place of series connected LEDs. In some embodiments, cascoded transistor $Q_1$ in conjunction with interface circuit 202 may be considered to be an attenuator or an attenuation circuit.

In an embodiment, the switching of cascode transistor $Q_1$ attenuates the current provided to load 206 in accordance with an attenuation factor, such that the pulse modulated signal has a pulse density that is related to the attenuation factor. In some cases, the attenuation factor is inversely proportional to the pulse density of the pulse modulated signal. In one example, when the pulse density of the pulse modulated signal is about 50%, the current provided to load 206 is attenuated by a factor of two. In another example, when the pulse density of the pulse modulated signal is about 10%, the current to load 206 is attenuated by a factor of ten. The attenuation factor may be defined in alternative ways in some embodiments. For example, the attenuation factor may be expressed in dB such that a pulse density of 50% corresponds with an attenuation factor of about 3 dB and a pulse density of 10% corresponds with an attenuation factor of about 10 dB. Alternatively, other known ways of expressing attenuation may be used. It should be understood that in some embodiments of the present invention, the actual amount of attenuation provided by a particular pulse density may differ from a strict relationship with the pulse density due to parasitic effects and other circuit non-idealities.

In an embodiment, interface circuit 202 turns on cascode transistor $Q_1$ when the pulse modulated signal is in a first state, and turns off cascode transistor $Q_1$ when the pulse modulated signal is in a second state. In some embodiments, the pulse modulated signal is a pulse width modulated signal. However, in alternative embodiments, the pulse modulated signal may include different forms of modulation, such as pulse density modulation. In an embodiment, interface circuit 202 is separate from IC 102. Accordingly, an IC 102 having five pins DRAIN, CS, VCC, GND, and CON may be used to implement an LED power supply that provides a dimming feature via interface circuit 202.

In alternative embodiments of the present invention, IC 102 may be implemented using alternative circuits. For example, control circuit 104 may be implemented on a separate IC from switching transistor $Q_2$, and in some embodiments, a separate driver circuit may be used to drive the gate of switching transistor $Q_2$. In further alternative embodiments, IC 102 may be implemented by circuitry that performs switched-mode power supply control using non-quasi-resonant operational modes. For example, hard switching may be implemented instead of valley switching. In further embodiments, IC 102 may be implemented using other control schemes such as discontinuous conduction mode (DCM), continuous conduction mode (CCM) or hysteretic control mode.

As shown, cascode transistor $Q_1$ and switching transistor $Q_2$ are implemented using n-channel enhancement mode metal oxide semiconductor field-effect transistors (MOSFETs). Alternatively, these transistors may be may be implemented using other types of MOSFETs such as a p-channel MOSFET, as well as insulated gate bipolar transistors (IGBT), power MOSFETs, and the like.

Figure 3:
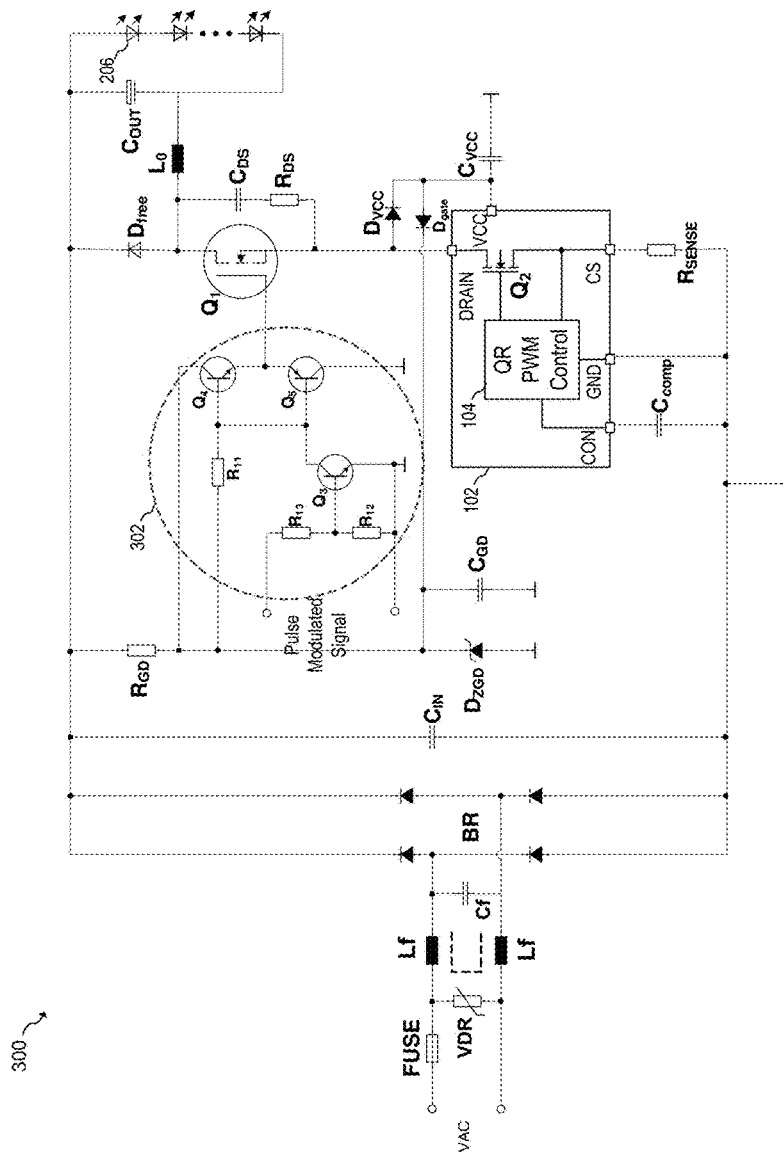
FIG. 3 illustrates a further embodiment power supply system.

FIG. 3 illustrates power supply system 300 according to a further embodiment of the present invention. As shown, the interface circuit 302 between the pulse modulated signal and the gate of cascode transistor $Q_1$ is implemented using npn bipolar junction transistors Q3 and Q4, pnp bipolar transistor Q5 and resistors $R_{11}$, $R_{12}$ and $R_{13}$. In an embodiment, the pulse modulated signal is applied to resistors $R_{12}$ and $R_{13}$ that function as a resistive voltage divider. The output of the voltage divider is coupled to the base of transistor Q3. During operation, the collector voltage of transistor $Q_3$ is pulled low when transistor $Q_3$ is turned on. Accordingly, pnp transistor $Q_5$, which functions as an emitter follower, pulls the gate of cascode transistor $Q_1$ low, thereby turning off cascode transistor $Q_1$ and preventing current from flowing from the drain of switching transistor $Q_2$ to inductor $L_0$. During this time, npn transistor $Q_4$ is shut off because its base is pulled low.

On the other hand, when transistor Q3 is turned off, resistor $R_{11}$ pulls the collector of transistor $Q_3$ to a voltage set by zener diode $D_{ZGD}$, which may be about 12 V in some embodiments. Alternatively, zener diodes having other voltages may be used. Resistor $R_{11}$ also serves to prevent capacitor $C_{VCC}$ from discharging through diode $D_{gate}$ and transistor $Q_3$ when the pulse modulated signal is high.

When the collector of $Q_3$ is pulled up, npn transistor $Q_4$ functions as an emitter follower and turns on cascode transistor $Q_1$, while pnp transistor $Q_5$ is shut off. In an embodiment, turning off transistor $Q_3$ may be accomplished by applying a low voltage to the pulse modulated signal port, applying a high impedance to the pulse modulated signal port, and/or open circuiting the pulse modulated signal port. Accordingly, power supply system 300 may be operated as a non-dimmable LED power supply when the pulse modulated signal port is disconnected.

In an embodiment, transistors $Q_4$ and $Q_5$ are configured to quickly turn on and turn off cascode transistor $Q_1$, thereby allowing cascode transistor $Q_1$ to attenuate current delivered to load 206 in accordance with an attenuation factor as described above. By using emitter followers, transistor $Q_4$ may be used to quickly charge the gate capacitance of cascode transistor $Q_1$ to make sure that the gate can be charged to a target value within a very short time. Similarly, transistor $Q_5$ may be used to quickly discharge the gate capacitance of cascode transistor $Q_1$. In some embodiments, the switching times for charging and discharging the gate of cascode transistor $Q_1$ is made to be faster than 50 ns. Using a fast switching time prevents temperature increase and power loss and through cascode transistor $Q_1$ as the transistor has intermediate values of drain-source resistance.

While interface circuit 302 is implemented using BJT transistors, other transistor types may be used in alternative embodiments. For example, in one alternative embodiment, transistors $Q_3$ and $Q_4$ may be implemented using n-channel MOSFET devices and transistor $Q_5$ may be implemented using a p-channel MOSFET device. In further alternative embodiments, the interface circuit can be implemented as a CMOS-Gate-Driver with a function "normally on."

Figure 4A:
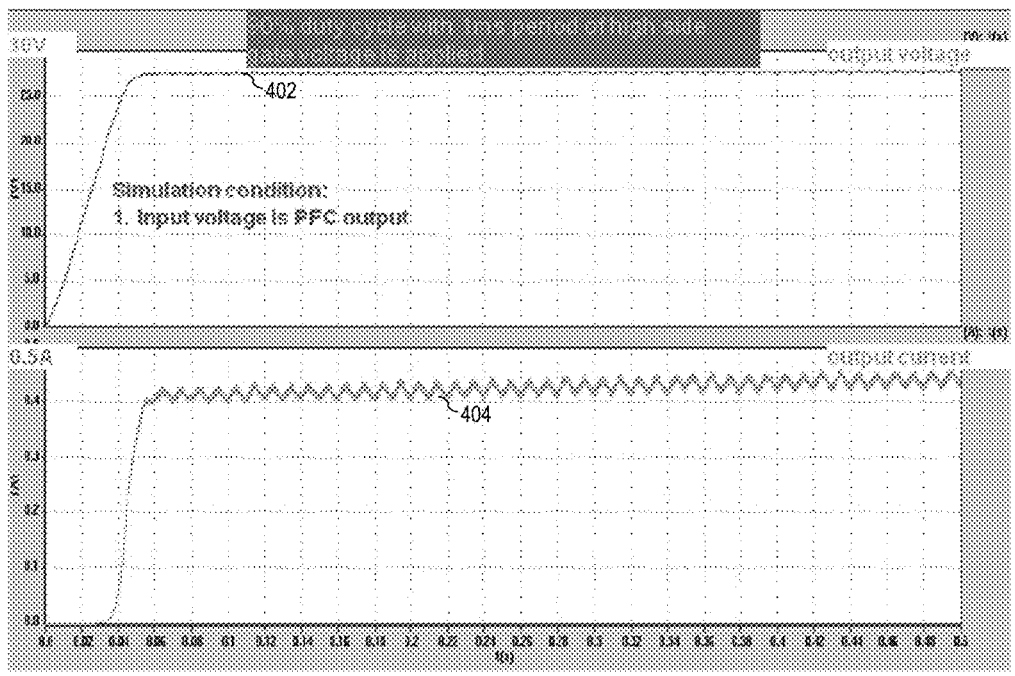
FIGS. 4a-4d illustrates waveform diagrams of an embodiment power supply system.

FIGS. 4a-4d illustrate waveforms of simulations of embodiment power supply systems that receive its input voltage from an AC/DC power factor converter (PFC). FIG. 4a illustrates a waveform diagram of a simulation in which the pulse modulated signal supplied to cascode transistor $Q_1$ has a 90% duty cycle corresponding to an attenuation factor of 1.1 or 0.45 dB. Trace 402 represents the output voltage of power supply and trace 404 represents the current supplied to the load of the power supply. As shown, after the output voltage represented by trace 402 ramps up to a voltage of about 27 volts, while the output current represented by trace 404 attains a value of about 0.41 A. The ripple on the current is ripple at twice the AC line frequency.

Figure 4B:
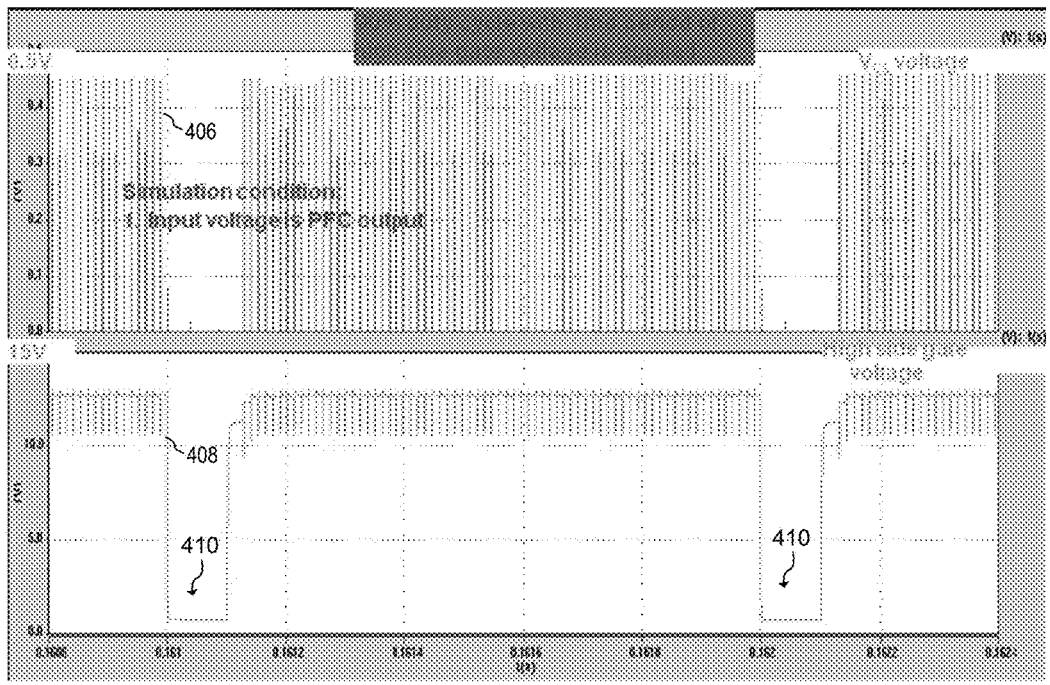

FIG. 4b illustrates a waveform diagram of a simulation of an embodiment power supply in which the pulse modulated signal supplied to cascode transistor $Q_1$ has a 90% duty cycle. Trace 406 represents a voltage at the source of switching transistor $Q_2$ and trace 408 represents the voltage at the gate of cascode transistor $Q_1$ corresponding to the incoming pulse modulated signal. As shown, the voltage at the source of switching transistor $Q_2$ represented by trace shows activity when the gate voltage of cascode transistor $Q_1$ represented by trace 408 is greater than 10 V. When the gate voltage of cascode transistor $Q_1$ is low during time periods 410, there is significantly reduced amount of switching activity at the source of switching transistor $Q_2$.

Figure 4C:
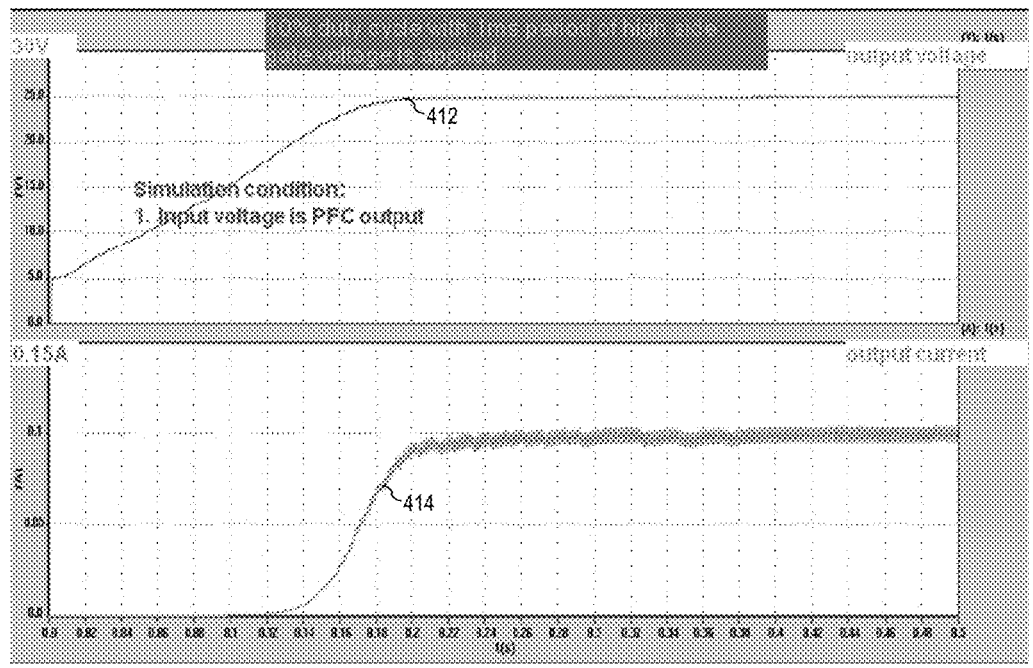

FIG. 4c illustrates a waveform diagram of a simulation in which the pulse modulated signal supplied to cascode transistor $Q_1$ has a 10% duty cycle corresponding to an attenuation factor of about 10 or about 10 dB. Trace 412 represents the output voltage of power supply and trace 414 represents the current supplied to the load of the power supply. As shown, after the input voltage represented by trace 412 ramps up to a voltage of about 25 volts, while the output current represented by trace 414 attains a value of about 0.1 A, which is less than the 0.41 A attained using the 90% duty cycle shown in FIGS. 4a and 4b.

Figure 4D:
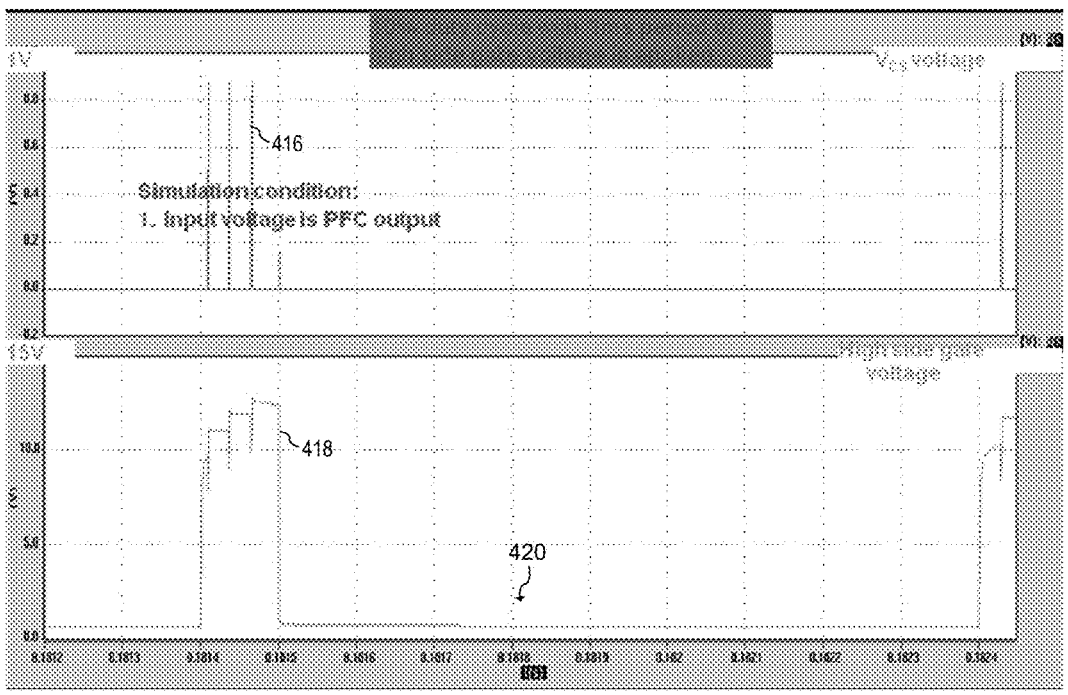

FIG. 4d illustrates a waveform diagram of a simulation of an embodiment power supply in which the pulse modulated signal supplied to cascode transistor $Q_1$ has a 10% duty cycle. Trace 416 represents a voltage at the source of switching transistor $Q_2$ and trace 418 represents the voltage at the gate of cascode transistor $Q_1$ corresponding to the incoming pulse modulated signal. As shown, the voltage at the source of switching transistor $Q_2$ represented by trace shows activity when the gate voltage of cascode transistor $Q_1$ represented by trace 418 is greater than 10 V. When the gate voltage of cascode transistor $Q_1$ is low during time periods 420, there is significantly reduced amount of switching activity at the source of switching transistor $Q_2$.

Figure 5:
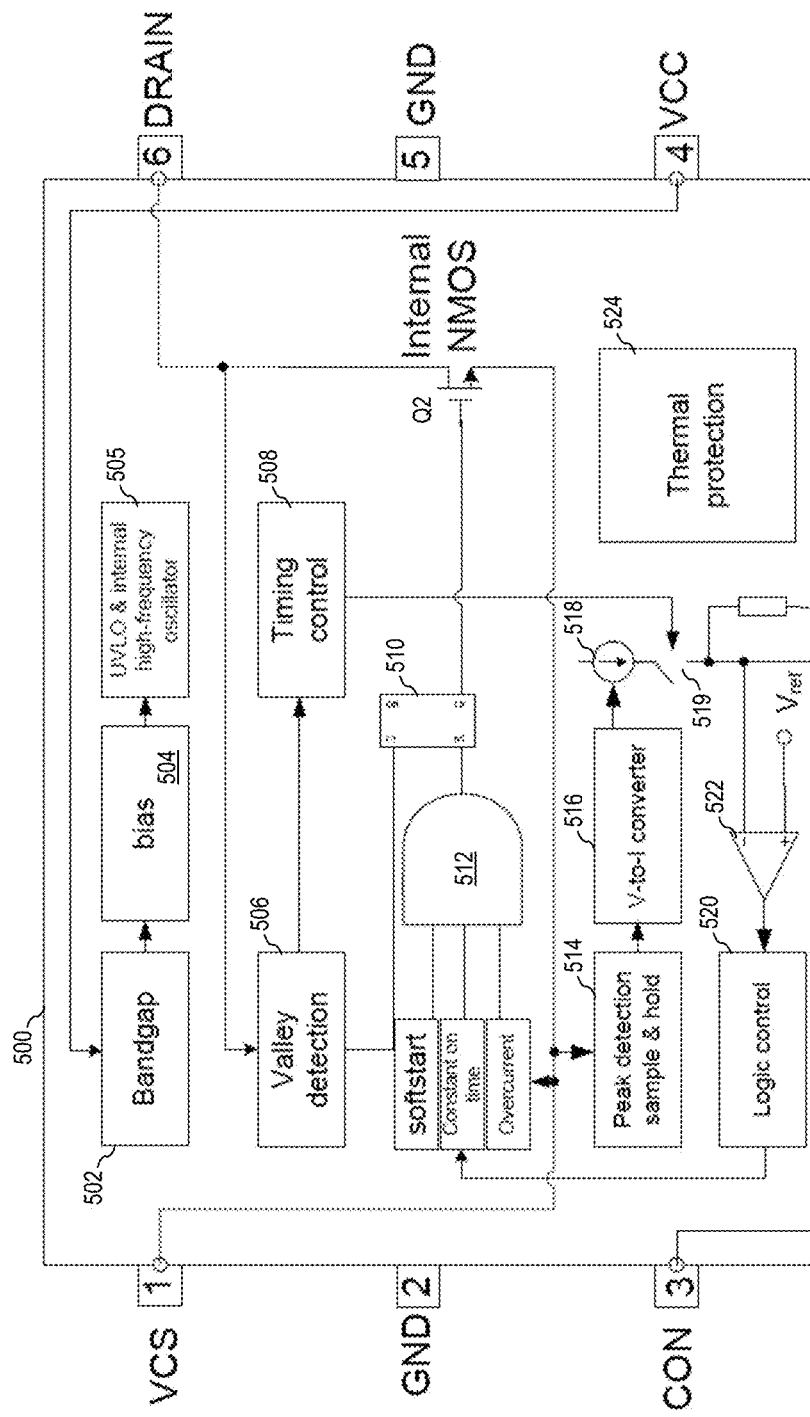
FIG. 5 illustrates a power supply controller integrated circuit (IC)

FIG. 5 illustrates IC 500 that may be used to implement buck converter IC 102 in the various embodiments described above. As shown, IC 500 includes an internal NMOS transistor Q2 that is used to implement the switching transistor. The gate of transistor Q2 is driven by the output of latch 510. As shown, latch 510 is activated by valley detection circuit 506 and deactivated by AND gate 512 that resets latch 510 when the outputs of a soft start block, a constant on time block and an overcurrent block are high. In an embodiment, the output of the soft start block is high after IC 500 has powered up, and the output of the overcurrent block is high when there is not overcurrent condition. The constant on time block provides an on-time that is based on a measured voltage of pin VCS, as well as a value of an external capacitor that is coupled to pin CON.

In an embodiment, peak detection sample and hold block 514 samples a voltage of pin VCS and voltage to current converter 516 converts this measured peak value to a current via current source 518. When timing control block 508 activates switch 519, the external capacitor coupled to pin CON is charged until the voltage of pin CON reaches voltage Vref as determined by comparator 522. Logic control block 520 monitors the output of comparator 522 and activates the constant on time block when the input of comparator 522 crosses threshold voltage Vref.

Bias to IC 500 is provided by bandgap 502 and bias generation block 504. IC 500 further includes an under voltage lockout mechanism and an oscillator in block 505, as well as a thermal protection block 524 that includes temperature sensor and thermal protection circuits. It should be appreciated that IC 500 is one example of many possible embodiment buck converter controller ICs. In alternative embodiments, other controller circuits and systems may be used.

Figure 6:
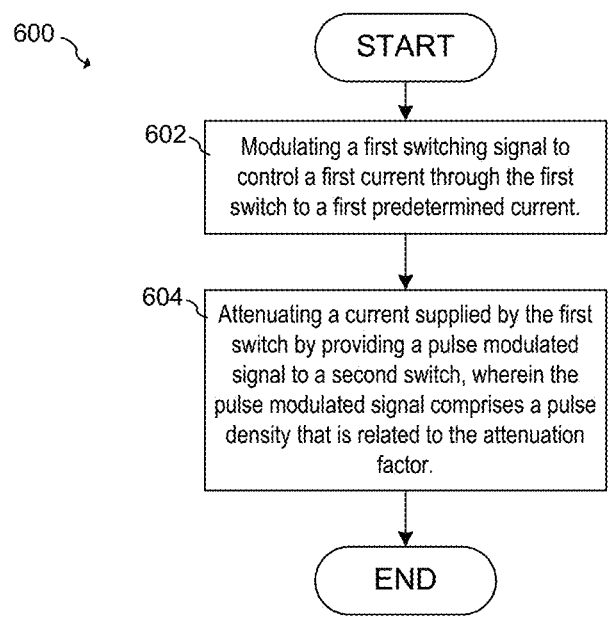
FIG. 6 illustrates a flowchart of an embodiment method.

FIG. 6 illustrates a block diagram of an embodiment method 600 of operating a switched-mode power supply. In step 602 a first switch coupled between an inductor and a reference node is controlled by modulating a first switching signal to control a first current through the first switch to a first predetermined current. In some embodiments, the modulating of the first switching signal may be performed by a buck converter controller that determines a duty cycle of a pulse width modulated signal according to a measured current though the first switch. In some embodiments, this current through the first switch is measured by measuring a voltage across a resistor coupled in series with the first switch. Next, in step 604, a current supplied by the first switch to the inductor is attenuated in accordance with an attenuation factor to form an attenuated current. In this step, attenuating includes providing a pulse modulated signal to a second switch coupled between the first switch and the inductor such that the pulse modulated signal has a pulse density that is related to the attenuation factor.

In accordance with various embodiments, circuits or systems may be configured to perform particular operations or actions by virtue of having hardware, software, firmware, or a combination of them installed on the system that in operation causes or cause the system to perform the actions. One general aspect includes a method of operating a switched-mode power supply that includes controlling a first switch coupled between an inductor and a reference node. Controlling includes modulating a first switching signal to control a first current through the first switch to a first predetermined current, and attenuating a current supplied by the first switch to the inductor in accordance with an attenuation factor to form an attenuated current. Attenuating includes providing a pulse modulated signal to a second switch coupled between the first switch and the inductor, where the attenuation factor is related to a pulse density of the pulse modulated signal. Other embodiments of this aspect include corresponding circuits and systems configured to perform the various actions of the methods.

Implementations of the method may include one or more of the following features. In some embodiments, the second switch includes a cascode transistor. Controlling the first switch may include controlling includes operating a quasi-resonant switched-mode power supply controller. In some implementations, the first switching signal includes a first pulse width modulated signal, and controlling the first switch includes controlling a duty cycle of the first pulse width modulated signal.

In an embodiment, providing the pulse modulated signal to the second switch includes applying the pulse modulated signal to a control node of a first transistor, pulling down a voltage of a control node of the first switch via a first follower transistor coupled between an output of the first transistor and the control node of the first switch, and pulling up the voltage of the control node of the first switch via a second follower transistor coupled between the output of the first transistor and the control node of the first switch. The first follower transistor may include a transistor of a first semiconductor type and the second follower transistor may include a transistor of a second semiconductor type opposite the first semiconductor type.

In some implementations, the first follower transistor includes a NPN bipolar junction transistor and the second follower transistor includes a PNP bipolar junction transistor. In some embodiments, the first transistor may include a NPN bipolar junction transistor. The method may further include supplying the attenuated current to a load circuit coupled to the inductor, which may include supplying the attenuated current to a light emitting diode. The pulse modulated signal may include a second pulse width modulated signal.

In an embodiment, controlling the first switch includes using a first integrated circuit including a controller and the first switch; and attenuating the current includes using a second circuit separate from the first integrated circuit. Implementations of the described techniques may include hardware, a method or process, or computer software on a computer-accessible medium.

Another general aspect includes a switched-mode power supply having a first switch; a first controller coupled to a control node of the first switch. The first controller is configured to provide a first switching signal to the control node of the first switch and configured to control a first current through the first switch by modulating the first switching signal. The switched mode power supply further includes an attenuator configured to attenuate the first current according to an attenuation factor. The attenuator includes a second switch having a signal path including a first node coupled to an output of the first switch and a second node configured to be coupled to an inductor, and the second switch includes a control node configured to receive a pulse modulated signal having a pulse density related to the attenuation factor. Other embodiments of this aspect include corresponding circuits and systems configured to perform the various actions of the methods.

Implementations may include one or more of the following features. The switched-mode power supply where the second switch includes a cascode transistor. The switched-mode power supply may further include the inductor, where the inductor is coupled between the second node of the second switch and a load terminal of the switched-mode power supply. The switched-mode power supply may further include a light emitting diode coupled to the load terminal of the switched-mode power supply. Moreover, the attenuator further includes an interface circuit coupled between a pulse modulated signal input port and the control node of the second switch in some implementations.

In an embodiment, the interface circuit includes: a first transistor having a control node coupled to the pulse modulated signal input port; a first follower transistor of a first semiconductor type coupled between an output of the first transistor and the control node of the second switch; and a second follower transistor of a second semiconductor type opposite the first semiconductor type. The second follower transistor is coupled between the output of the first transistor and the control node of the second switch. In an implementation, the first transistor includes a NPN bipolar junction transistor, the first follower transistor includes a PNP bipolar junction transistor, and the second follower transistor includes a NPN bipolar junction transistor. The switched-mode power supply may further include a first resistor coupled between a supply node of the switched-mode power supply and control nodes of the first follower transistor and the second follower transistor.

In some embodiments, the interface circuit further includes a voltage divider coupled between the pulse modulated signal input port and a control node of the first transistor. In a further example, the first switch and the first controller are integrated on a first integrated circuit and the attenuator is external to the first integrated circuit. Implementations of the described techniques may include hardware, a method or process, or computer software on a computer-accessible medium.

A further general aspect includes a dimmable light emitting diode (LED) power supply including a first integrated circuit including a controller and a first switch. The controller is configured to control a first current through the first switch by modulating a first switching signal provided to a control node of the first switch. The LED power supply further includes an an attenuation circuit including a cascode transistor coupled to an output of the first switch, and an interface circuit coupled between an input port configured to receive a second switching signal and a control node of the cascode transistor. The attenuation circuit is configured to attenuate the first current according to an attenuation factor that is related to a pulse density of the second switching signal, and the attenuation circuit is external to the first integrated circuit. Other embodiments of this aspect include corresponding circuits and systems configured to perform the various actions of the methods.

Implementations may include one or more of the following features. The dimmable LED power supply further including an inductor coupled between an output of the cascode transistor and an output port of the dimmable led power supply, and a freewheeling diode coupled between the output of the cascode transistor and a power input node. The dimmable LED power supply may further include a rectifier coupled between an AC input port and the power input node. The output port of the dimmable led power supply may be configured to be coupled to an LED.

In an embodiment, the interface circuit includes a voltage divider coupled to the input port configured to receive the second switching signal, a first transistor having a control node coupled to an output of the voltage divider, a first follower transistor of a first semiconductor type coupled between an output of the first transistor and the control node of the cascode transistor, a second follower transistor of a second semiconductor type opposite the first semiconductor type that is coupled between the output of the first transistor and the control node of the cascode transistor; and a first resistor coupled between a supply node of the dimmable LED power supply and control nodes of the first follower transistor and the second follower transistor.

In an implementation, the dimmable led power supply further includes a second resistor coupled between the first resistor and the supply node of the dimmable led power supply. The first transistor may include a NPN bipolar junction transistor; the first follower transistor may include a PNP bipolar junction transistor; and the second follower transistor may include a NPN bipolar junction transistor. Implementations of the described techniques may include hardware, a method or process, or computer software on a computer-accessible medium.

Advantages of some embodiments include the ability to provide an inexpensive LED power supply that provides a dimming function. A further advantage includes the ability to provide a LED dimming function using an inexpensive switched-mode buck converter control IC.

Further advantages of embodiments include the ability to start-up a local power supply of a switched-more power supply control circuit in a cascode topology via a cascode transistor.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media that is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. In addition, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. In addition, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of intraoperative hardware units, including one or more processors as described above, in conjunction with suitable software and/or firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating a switched-mode power supply, the method comprising:
   controlling a first switch coupled between an inductor and a reference node, controlling comprising modulating a first switching signal to control a first current through the first switch to a first predetermined current; and
   attenuating a current supplied by the first switch to the inductor in accordance with an attenuation factor to form an attenuated current, attenuating comprising providing a pulse modulated signal to a second switch coupled between the first switch and the inductor, wherein the attenuation factor is related to a pulse density of the pulse modulated signal; and
   supplying the attenuated current to a load circuit coupled to the inductor.

2. The method of claim 1, wherein the second switch comprises a cascode transistor.

3. The method of claim 1, wherein controlling the first switch comprises controlling comprises operating a quasi-resonant switched-mode power supply controller.

4. The method of claim 1, wherein:
   the first switching signal comprises a first pulse width modulated signal; and
   controlling the first switch comprises controlling a duty cycle of the first pulse width modulated signal.

5. The method of claim 1, wherein providing the pulse modulated signal to the second switch comprises:
   applying the pulse modulated signal to a control node of a first transistor;
   pulling down a voltage of a control node of the first switch via a first follower transistor coupled between an output of the first transistor and the control node of the first switch; and
   pulling up the voltage of the control node of the first switch via a second follower transistor coupled between the output of the first transistor and the control node of the first switch.

6. The method of claim 1, wherein supplying the attenuated current to the load circuit comprises supplying the attenuated current to a light emitting diode.

7. The method of claim 6, wherein the pulse modulated signal comprises a second pulse width modulated signal.

8. The method of claim 1, wherein:
   controlling the first switch comprises using a first integrated circuit comprising a controller and the first switch; and
   attenuating the current comprises using a second circuit separate from the first integrated circuit.

9. The method of claim 1, wherein the inductor is coupled between a load path of the second switch and the load circuit.

10. The method of claim 1, wherein providing the pulse modulated signal to the second switch comprises:
    receiving the pulse modulated signal by a control node of a first transistor;
    buffering the pulse modulated signal by a first follower transistor of a first semiconductor type coupled between an output of the first transistor and a control node of the second switch; and
    buffering the pulse modulated signal by a second follower transistor of a second semiconductor type opposite the first semiconductor type, the second follower transistor coupled between the output of the first transistor and the control node of the second switch.

11. The method of claim 1, further comprising controlling a brightness of an LED coupled to the inductor according to the attenuation factor.

12. A switched-mode power supply comprising:
    a first switch;
    a first controller coupled to a control node of the first switch, the first controller configured to provide a first switching signal to the control node of the first switch and configured to control a first current through the first switch by modulating the first switching signal; and
    an attenuator configured to attenuate the first current according to an attenuation factor, the attenuator comprising a second switch having a signal path including a first node coupled to an output of the first switch and a second node configured to be coupled to an inductor, the second switch comprising a control node configured to receive a pulse modulated signal having a pulse density related to the attenuation factor.

13. The switched-mode power supply of claim 12, wherein the second switch comprises a cascode transistor.

14. The switched-mode power supply of claim 12, further comprising the inductor, wherein the inductor is coupled between the second node of the second switch and a load terminal of the switched-mode power supply.

15. The switched-mode power supply of claim 14, further comprising a light emitting diode coupled to the load terminal of the switched-mode power supply.

16. The switched-mode power supply of claim 12, wherein the attenuator further comprises an interface circuit coupled between an pulse modulated signal input port and the control node of the second switch.

17. The switched-mode power supply of claim 16, wherein the interface circuit comprises:
    a first transistor having a control node coupled to the pulse modulated signal input port;
    a first follower transistor of a first semiconductor type coupled between an output of the first transistor and the control node of the second switch; and
    a second follower transistor of a second semiconductor type opposite the first semiconductor type, the second follower transistor coupled between the output of the first transistor and the control node of the second switch.

18. The switched-mode power supply of claim 17, wherein:
    the first transistor comprises a NPN bipolar junction transistor;
    the first follower transistor comprises a PNP bipolar junction transistor; and
    the second follower transistor comprises a NPN bipolar junction transistor.

19. The switched-mode power supply of claim 17, further comprising a first resistor coupled between a supply node of the switched-mode power supply and control nodes of the first follower transistor and the second follower transistor.

20. The switched-mode power supply of claim 17, wherein the interface circuit further comprises a voltage divider coupled between the pulse modulated signal input port and a control node of the first transistor.

21. The switched-mode power supply of claim 12, wherein the first switch and the first controller are integrated on a first integrated circuit and the attenuator is external to the first integrated circuit.

22. A dimmable light emitting diode (LED) power supply comprising:

a first integrated circuit comprising a controller and a first switch, the controller configured to control a first current through the first switch by modulating a first switching signal provided to a control node of the first switch; and an attenuation circuit comprising a cascode transistor coupled to an output of the first switch; and an interface circuit coupled between an input port configured to receive a second switching signal and a control node of the cascode transistor, wherein the interface circuit comprises:

a voltage divider coupled to the input port configured to receive the second switching signal, a first transistor having a control node coupled to an output of the voltage divider, a first follower transistor of a first semiconductor type coupled between an output of the first transistor and the control node of the cascode transistor, a second follower transistor of a second semiconductor type opposite the first semiconductor type, the second follower transistor coupled between the output of the first transistor and the control node of the cascode transistor, and a first resistor coupled between a supply node of the dimmable LED power supply and control nodes of the first follower transistor and the second follower transistor.

23. The dimmable LED power supply of claim 22, further comprising:

an inductor coupled between an output node of the cascode transistor and an output port of the dimmable LED power supply; and a freewheeling diode coupled between the output of the cascode transistor and a power input node.

24. The dimmable LED power supply of claim 23, further comprising a rectifier coupled between an AC input port and the power input node.

25. The dimmable LED power supply of claim 22, further comprising an LED coupled to an output node of the cascode transistor.

26. The dimmable LED power supply of claim 22, wherein he attenuation circuit is configured to attenuate the first current according to an attenuation factor that is related to a pulse density of the second switching signal.

27. The dimmable LED power supply of claim 26, wherein the attenuation circuit is external to the first integrated circuit.

* * * * *